United States Patent [19]
Descamps

[11] Patent Number: 4,495,513
[45] Date of Patent: Jan. 22, 1985

[54] BIPOLAR TRANSISTOR CONTROLLED BY FIELD EFFECT BY MEANS OF AN ISOLATED GATE

[75] Inventor: Bernard Descamps, Paris, France
[73] Assignee: Thomson-CSF, Paris, France
[21] Appl. No.: 388,500
[22] Filed: Jun. 14, 1982

[30] Foreign Application Priority Data

Jun. 16, 1981 [FR] France .................................. 81 11835

[51] Int. Cl.³ ............................................ H01L 27/02
[52] U.S. Cl. ...................................... 357/43; 357/41; 357/51; 357/34; 357/23
[58] Field of Search ........................ 357/43, 23.1, 23.8, 357/23.14, 46, 41, 51, 34

[56] References Cited

U.S. PATENT DOCUMENTS

| | | | |
|---|---|---|---|
| 4,143,421 | 3/1979 | Tonnel et al. .................... | 357/43 X |
| 4,327,368 | 4/1982 | Uchida ............................. | 357/43 X |
| 4,367,509 | 1/1983 | Snyder et al. .................... | 357/51 X |
| 4,407,005 | 9/1983 | Bell et al. ........................ | 357/41 X |

Primary Examiner—Andrew J. James
Assistant Examiner—William A. Mintel
Attorney, Agent, or Firm—Cushman, Darby & Cushman

[57] ABSTRACT

A bipolar semiconductor structure the conductive and blocked states of which are controlled by an isolated gate comprises a p+ type substrate constituting the emitter of a bipolar transistor, an N type epitaxial layer constituting the base, a p+ type area having a large surface, constituting a collector, covered with a collector contact and surrounded by an area wherein the epitaxial N type layer is exposed, an n+ type source area included in the collector area and extending along the border of the same so as to define an interval which constitutes the control gate of the structure, a resistive source access zone connected, on the one hand, to the source, and on the other hand, to the collector contact, the resistance of this zone being sufficient for preventing the structure from being rendered conductive in an irreversible manner.

6 Claims, 4 Drawing Figures

AA

BIPOLAR TRANSISTOR CONTROLLED BY FIELD EFFECT BY MEANS OF AN ISOLATED GATE

The present invention is related to power transistors.

It is endeavoured to produce transistors capable of allowing a current of high intensity to pass, and of resisting high break-down voltages, while requiring only a low control power for passing from the blocked state to the conductive state, and vice versa. It is desired to attain values of about 400 V for the break-down voltage, and about 10 A for the current intensity, in the case of a silicon transistor unit of about 10 square millimeters.

It has already been suggested to use vertical field effect transistors (DMOS or VMOS); however, these transistors show one major drawback in that they have a high resistance in the conductive state, especially on account of the fact that the conduction in the drain is ensured exclusively by majority carriers.

The structures envisaged up to now, which use simultaneous conduction by majority and minority carriers, as well as field effect control by means of an isolated gate, constitute in fact thyristors, i.e. units that are able to be rendered conductive by a very small control power, but cannot be blocked unless the current is suppressed in the unit.

The present invention is directed to a semiconductor structure allowing a strong current to pass by conduction through majority and minority carriers, i.e. having a reduced internal resistance, said structure being controlled by field effect, using an isolated gate, i.e. by means of a low control power, and operating not in the manner of a thyristor, but in the manner of a transistor, whereby the unit can be rendered conductive as well as be blocked by the action of the control electrode.

The structure according to the present invention essentially comprises a vertical bipolar power transistor, the emitter and collector of which constitute with their respective contacts, the main electrodes of the structure, the base of the latter being connected to the drain of the isolated gate field effect transistor (MOS), whereby a strong current passes between the emitter and the collector, which current is generated by an amplified base current of the bipolar transistor when the MOS transistor is rendered conductive.

The emitter is the semiconductor substrate on which the structure is formed; said substrate is doped with an impurity of a first type of conductivity. An emitter contact is formed by metallization of the lower surface of the substrate.

The base is constituted by a slightly doped epitaxial layer covering the substrate and having a conductivity of the opposite type.

The collector is constituted by a zone doped from the surface and having a conductivity of the first type. This zone is strongly doped, at least in its center; it has a large surface and is covered in the major part of said surface with a metallization layer constituting a collector contact. It is endeavoured to obtain by this arrangement a low resistance of the collector zone, not only with a view to achieving a low resistance of the transistor in the conductive state—which is one of the objects to be achieved—but with also a view to avoiding, in a manner that will be explained herein-below, a thyristor noise effect in the successive zones having alternating types of conductivity.

The drain of MOS transistor is constituted by an epitaxial layer portion having the above-mentioned second (i.e. opposite) type of conductivity and being flush with the semiconductor plate outside of the collector zone. No drain electrode is provided.

The source is constituted by a zone doped from the surface with an impurity of the second type, within the collector zone having a conductivity of said first type, and along the border of said collector zone; the interval between the source zone and peripheral border of the collector zone constitutes, in an area where it is flush with the surface of the epitaxial layer, a channel area for the MOS transistor. This channel area is covered with a thin isolating layer which is covered, in turn, with a conductive layer constituting the control gate of the MOS transistor and at the same time the control electrode of the structure according to the invention.

The source zone is indirectly connected electrically to the metallization layer of the collector through a resistive source access zone, one end of which is electrically connected to the source, while its other end is connected to the metallization layer of the collector. This resistive source access zone is constituted by monocrystalline or polycrystalline silicon. Its function consists in causing a voltage decrease, substantially proportional to the drain current, between the collector electrode and the source zone, so as to prevent thereby a noise thyristor initiating effect in a manner which will be explained herein-after.

Thus the considerable reduction of the internal resistance of the collector zone (due to its strong doping and its large surface) acts in combination with the provision of a sufficiently high source access resistance to prevent the field effect controlled bipolar transistor from being converted into a thyristor when elevated current intensity values are prevailing.

In the structure according to the invention the conduction is ensured by majority carriers as well as by minority carriers, since the main current is collector current of a bipolar transistor.

The break-down voltage between the collector and the emitter is elevated since, in the straight direction this voltage is the break-down voltage between the drain and the source of a MOS transistor, while in the reverse direction said voltage is the break-down voltage through the slightly doped base of a vertical bipolar transistor.

The control current is extremely low, due to the fact that control is achieved through the isolated grid of the MOS transistor.

It is possible to create the resistive source access zone by providing on the surface of the monocrystalline silicon in the collector area narrow areas or regions, doped with an impurity similar to the one used for the source, said narrow regions extending from the source zone proper (which extends along the channel area) in a direction transverse with respect to that of the border channel, toward the inside of the collector area; the metallization layer of the collector, which is in contact with the major portion of the collector area (having a conductivity of the first type) also is in contact with the narrow areas having a conductivity of the second type, but only at locations spaced from the source proper which extends along the border of the channel.

It is also possible to provide the resistive source access zone in the form of a polycrystalline silicon layer deposited on an isolating layer and electrically connected, on the one hand, directly to the metallization contact layer of the collector and, on the other hand, directly or through a metallic deposited layer to the source area.

Other features, objects and advantages of the present invention will become apparent from the following description which refers to the appended Figures and is given by way of illustration, but not of limitation.

Figure 1:
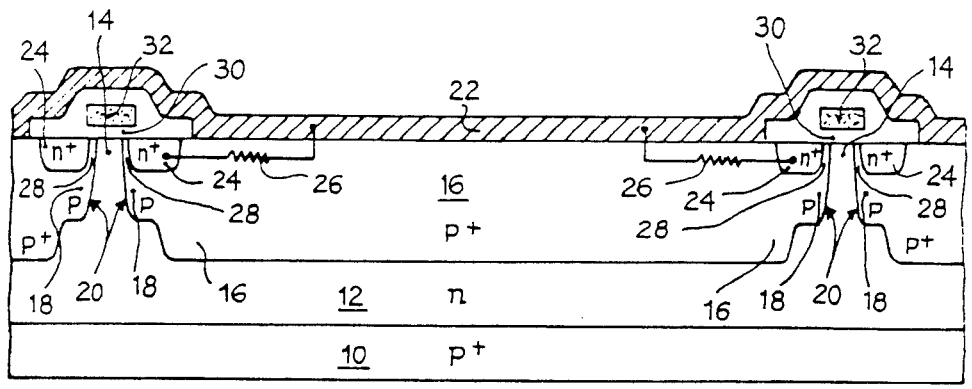
FIG. 1 is a sectional view of the structure according to the invention and illustrates the main principle thereof.

The bipolar transistor structure controlled by field effect in accordance with the invention is shown in section in FIG. 1.

The transistors considered here are bipolar power transistors, and it will be understood that the structure may comprise an entire symmetrical network of cells connected in series, each cell comprising one bipolar transistor element and one MOS transistor element controlling the same. One single cell will be described hereinbelow; however, FIG. 1 clearly illustrates the symmetry existing between any two adjacent cells.

The bipolar transistor is formed in a silicon plate comprising a substrate 10 which has a conductivity of a first type (type p in the embodiment shown). The doping is comparatively strong and is indicated in the Figures by symbol p+.

Said substrate is uniformly covered with an epitaxial silicon layer 12 which has a conductivity of a second, i.e. opposite type, and which is comparatively slightly doped.

In this epitaxial layer 12 are formed, starting from the surface, p type doped zones which extend over the major portion of the surface of the plate and leave between each other narrow intervals 14 wherein the epitaxial layer 12 with its initial n-type doping is exposed at or flush with the silicon surface.

In the figures the vertical dimensions do not correspond to a real scale, whereas the horizontal or lateral dimensions are drawn to scale; consequently, it is evident that the major portion of the epitaxial layer 12 has been submitted to a type n doping. The dimension of the p areas may be for example about 100 microns and that of the intervals 14 may be e.g. about ten microns.

In actual practice, the type p doping is preferably effected in two stages, the first of which consists in doping to a small depth with a reduced concentration (as indicated by reference p in FIG. 1) by ionic implantation of diffusion, while the second stage comprises a further doping to a greater depth with a higher concentration (as indicated by reference p+), this stronger and deeper doping being effected, for example, by diffusion, but on a surface slightly smaller than the corresponding area wherein the first doping had been carried out, in such a manner that finally the major portion of the surface of the epitaxial layer has undergone a strong, deep doping (p+), while this doped area is surrounded by a zone having the same type of conductivity but the doping of which is less strong and less deep. The central type p+ zone is designated by reference numeral 16, and the p type zone is designated by reference numeral 18. The outer peripheral border of type p zone 18, which is adjacent to the exposed portion 14 of the epitaxial layer 12 is designated by reference numeral 20.

Type p+ substrate 10 constitutes the emitter zone of the PNP type bipolar transistor. The lower surface of the substrate may be covered with a metallizing layer constituting thus an emitter contact. It is also possible to provide a p+ type access sink or well connecting the surface to the substrate, when it is desired to establish an emitter contact at the upper face of the plate.

The base area of the bipolar transistor is constituted by the portion of epitaxial layer 12 which is located above p+ type zone 16. No base contact is provided.

The p+ type zone 16 constitutes the collector zone of the PNP transistor. On the major portion of its upper surface (which, as indicated, is the major portion of the silicon surface) a conductive layer 22 (e.g. aluminum layer) is deposited and forms the collector contact.

Zones 14 which are those parts of the n type epitaxial layer that are flush with the surface along the borders of p type zones 18 constitute the drains of field effect transistors N channel MOS transistors. No drain contact is provided, no more than a base contact is provided, and it will be understood that both the base and the drain are formed in the n type epitaxial layer 12.

Strongly doped n+ type areas 24 are formed from the surface in areas 16 and 18 which had previously been doped with a p type impurity. These are source areas of the field effect transistor; they extend longitudinally (in FIG. 1 they are shown as extending in a direction perpendicular to the plane of the drawing) along the border 20 of p type areas 18, while defining a narrow p type interval between themselves and said border. This narrow interval comprises a portion 28 flush with the silicon surface, which constitutes the channel area of the field effect transistor. The n+ type source areas 24 have a depth smaller than that of p type areas 18.

The flush portion 28 of the channel areas is covered with a thin isolating layer 30 (preferably made of thermal silicon oxide) which is covered in turn with a conductive gate area 32 made of doped polycrystalline silicon or aluminum. In practice, taking into account the narrowness of the interval 14 between the various p type areas, isolating layer 30 and conductive gate 32 entirely cover this interval and the two channel areas 28 adjacent to said interval. This results in the provision of a common control electrode 32 having a reduced width and extending above interval 14 and zones 28 located in the immediate vicinity thereof. This electrode, while controlling channel areas 28 on either side of interval 14, controls the conduction of the two bipolar transistors corresponding to areas 16 and 18 separated by interval 14.

One feature is not apparent in FIG. 1, namely: a resistive connection (symbolically indicated by a resistor 26) between each source area 24 and the metallic collector contact 22. When examining FIGS. 2 and 3 it will be understood why this resistive connection 26 is not shown materially in FIG. 1, the latter being a sectional view taken along line A—A of FIG. 2 which is a plan view.

The structure according to the invention operates as follows: a positive potential difference is applied across the collector and the emitter, as usual for any bipolar PNP transistor.

When no control voltage is applied to control electrode 32 of the MOS transistor no channel is formed in areas 28, and said MOS transistor remains in the blocked state. The polarization of the collector-base junction is reversed. No current can pass in the base. Thus, the potential of base area remains substantially equal to the potential level of the emitter.

No current is allowed to pass in the structure between the emitter and the collector.

When a sufficient positive potential (above the threshold voltage of the MOS transistor) is applied to control electrode 32 a channel is formed in areas 28 and electrically connects the drain to the source, so that the potential of the drain—which had been initially very close to that of the emitter—drops and thus tends to reach a value close to the potential of the source (which potential is substantially equal to that of the collector).

Consequently, the potential of the base also drops, since the base and the drain are constituted by the same n type area. The emitter-base junction is polarized in the straight direction whereby carriers from the emitter are injected into the base; these carriers are accelerated in the direction toward the collector.

The bipolar transistor is rendered conductive and transmits a considerable current between its emitter and its collector.

When the application of control voltage to electrode 32 is discontinued the potential of the drain and the base increase, since the base current can no longer flow, and the bipolar transistor is blocked.

The bipolar transistor is adapted to allow currents of a high density to pass. For this reason it is provided not only with a large surface of the collector area but also with a large size metallic contact which extends nearly over the entire surface of area 16; furthermore, this area 16 is strongly doped.

However, a certain internal resistance of the collector subsists, which creates a voltage gradient that, under conditions of elevated current, may reach values above the activating voltage of a p-n junction. If the source area were connected directly to the potential of the collector contact, this voltage gradient might render the junction between the source and the p type area 18 conductive. The result would be an increase of the base current and thus an increase of the collector current; the process is divergent and a maximum collector current would occur, which cannot be stopped. This is self-polarization phenomenon occurring in the PNP bipolar transistor. This phenomenon may also be explained by the fact that the voltage decrease in the collector leads to the type of conduction of a noise thyristor constituted by the succession of areas 24 (source), 16 (collector), 12 (base) and 10 emitter having alternating types of conductivity. While having a reduced active surface (corresponding to the area of source 24) such thyristor maintains the bipolar transistor in the conductive state and allows a strong current to pass to the base, which current can only be suppressed when the thyristor is actuated, and which is amplified by the transistor.

With a view to avoiding this undesirable phenomenon, not only the internal resistance of the collector is reduced to as low a value as possible by the means indicated, but furthermore, it is provided that the source areas 24 are not connected directly to the collector contact, said areas being, on the contrary, connected to said contact through resistive source access zones symbolically indicated by resistors 26. When the collector current increases due to an increase of the base current (and thus of the drain current) of the MOS transistor, a voltage gradient is created in the resistive zone through which the drain current passes, and consequently the voltage gradient across the terminals of the source-channel junction is no longer equal to the voltage current in the collector area, but is reduced to the value of the voltage gradient across resistance 26.

Since these voltage gradients vary substantially parallelly resistance 26 needs only to be selected sufficiently high for preventing the junction from becoming conductive for the maximum current which would be liable to pass through the transistor.

In practice, resistance 26 should be higher than the product of the internal resistance of the collector multiplied by the current gain of the bipolar transistor.

A resistance of several Ohms or several tens of Ohms will be perfectly convenient in the case of the power transistors considered here.

Figure 2:
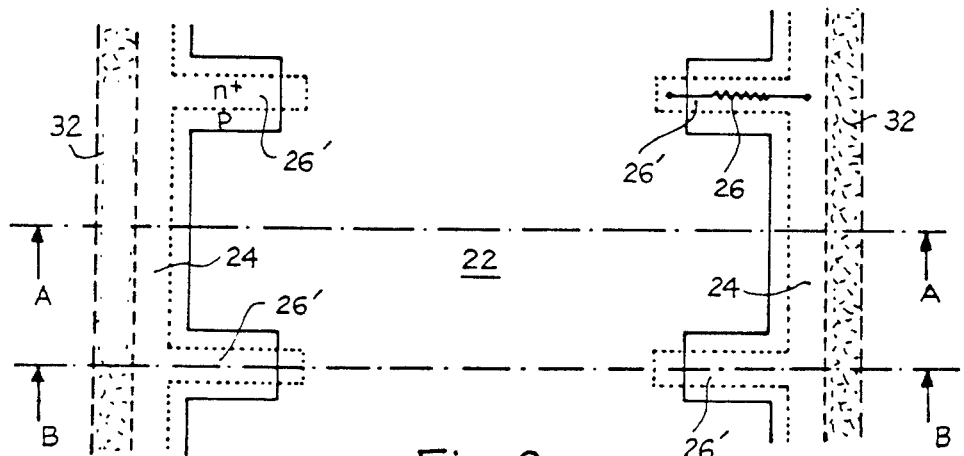
FIG. 2 is a plan view of a first embodiment of the invention, corresponding to FIG. 1.
Figure 3:
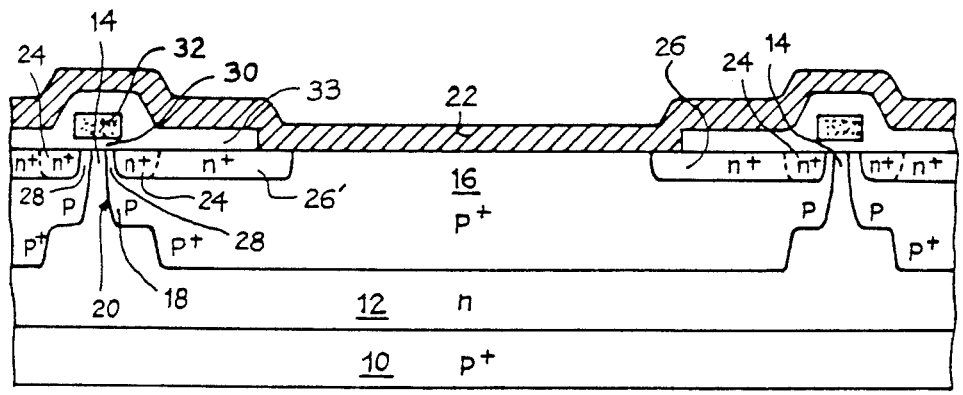
FIG. 3 is a sectional view taken along line B—B in FIG. 2.

FIG. 2 shows in combination with FIG. 3 how the resistive source access zones may be realized; these zones are n+ type zones formed within the collector area 16 at the same time and in the same manner as the source areas. They constitute substantially narrow transverse projections extending from a source area 24 (which extends longitudinally along a p type area border); said narrow transverse projections are directed toward the inner part of the p+ type zones (16). The collector contact which covers the major portion of the surface of the p+ type areas (16) is also in contact with the end (spaced from the source) of source access zones 26', but not in contact with source areas 24. For this purpose the metallic contact is cut to define a recessed shape at the level of each lateral projection constituting a zone 26'. The depth of the recess is of course smaller than the length of the projection, and its length is greater than the width of the projection, in such a manner that the metallization layer of the collector is in contact only with the end of zones 26', without engaging other portions of n+ type silicon.

The ratio of the length to the width of zones 26', determines the magnitude of the resistance thus defined. When the resistance of the n+ type zone is equal to several Ohms per square, this ratio may be equal to several units.

FIG. 3 is a sectional view quite similar to FIG. 1, but is taken at the level of line B—B of FIG. 2, i.e. at the level of a zone 26'; this Figure shows the provision of resistive access zones 26' which do not appear in the sectional view of FIG. 1. It can be seen that the recesses are provided in the contact zone proper between the metallization layer and the silicon. In FIG. 3 the recesses are not formed by interruptions or discontinuities of the metallization layer, but by areas in which the metallization layer is isolated from the silicon by an oxide layer 33 having the shape of the recesses shown in FIG. 2.

Figure 4:
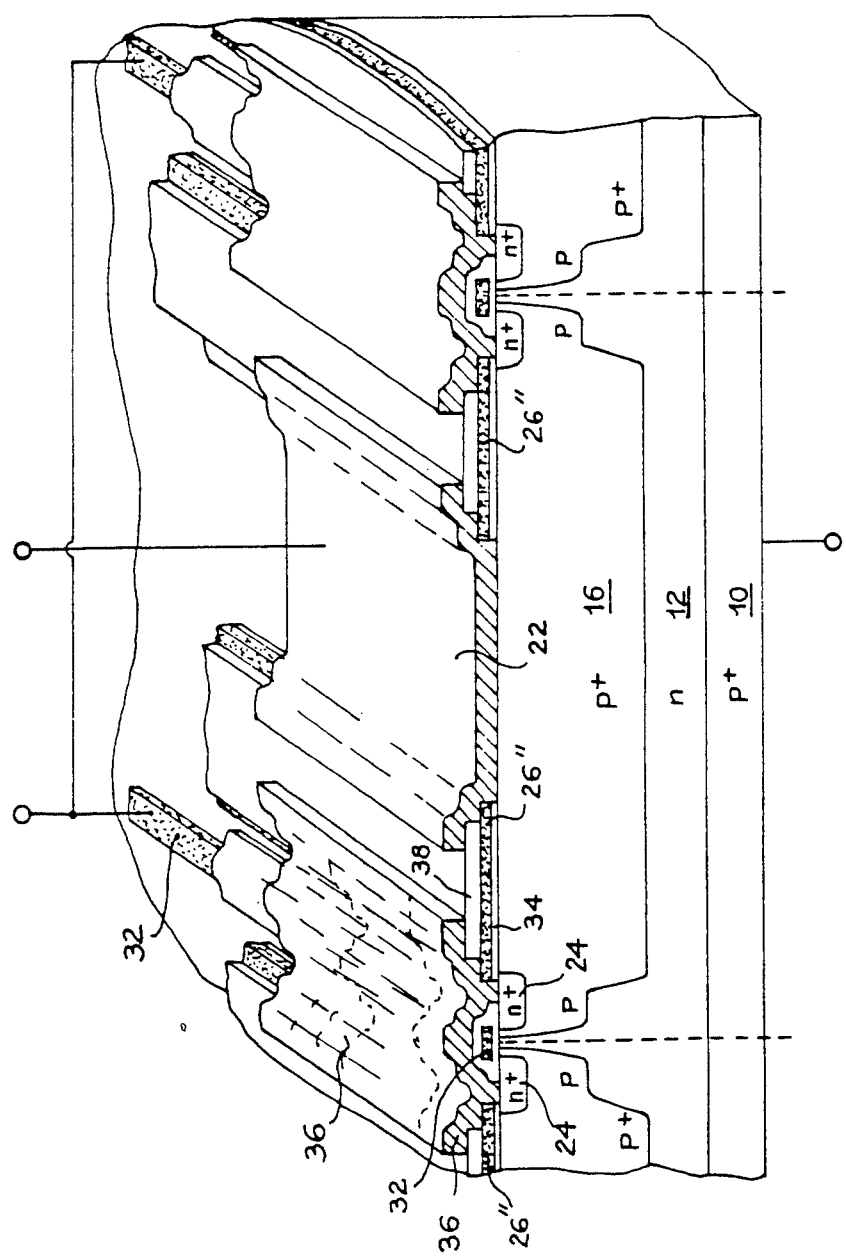
FIG. 4 is a perspective view, partially in section, showing a second embodiment of the invention.

FIG. 4 shows another embodiment of the resistive source access connections 26.

The basic structure is the same as the one described with reference to FIG. 1, as regards the differently doped areas in the substrate and the epitaxial layer of monocrystalline silicon. The thin isolating layer and the conductive gate covering the same are also of the same nature as described with reference to FIG. 1. However the resistive connection 26 is constituted by a layer of polycrystalline silicon 26" which may be deposited at the same time as the control gate 32 when the latter is constituted by polycrystalline silicon. Said layer 26" is deposited on a silicon oxide layer 34 which isolates layer 26" from the p+ type area. It is in contact, on the one hand, with the source area 24, either directly when the oxide layer 34 is interrupted above the source area and when the polycrystalline silicon is deposited and retained above the source area, or else indirectly as shown in FIG. 4 by means of the metallic layer 36 covering the source area without superficial oxide as well as an end of the polycrystalline silicon layer 26" without superficial oxide. On the other hand, layer 26" is in contact with the metallization layer of collector 22 which covers its end as it covers p+ type area 16.

During manufacture the deposited polycrystalline silicon is preferably cut and then covered with protective oxide, and this oxide layer is cut so as to expose the surfaces at the locations at which the metal is consecutively to be deposited. Thus an oxide layer 38 subsists on zone 26", except at the locations where it is in contact with the metal.

The polycrystalline silicon may be doped with an n type impurity either in situ, i.e. at the time of depositing, or at a later time. Its resistance may be about 20 Ohms per square (i.e. higher than that of the monocrystalline silicon strongly doped with an n+ type impurity). The polycrystalline silicon layer 26" which acts as a resistive connection between the collector contact and the source area 24 (as shown in FIG. 4) extends in the form of transverse lugs of fingers spaced from each other, each lug or finger starting from the source area and extending toward the centre of the collector area; the collector contact may then extend between the polycrystalline silicon lugs or fingers, i.e. over a larger surface, and may have a recessed configuration as shown in FIG. 2.

The above description thus relates to a semiconductor structure which, on account of its properties and its constitution may be defined as being a bipolar transistor (since the main conduction is ensured by majority and minority carriers) of the field effect controlled type, or—still more precisely—of the type controlled by an isolated gate.

The above described transistor is of the PNP type. The control electrode must receive a positive potential (with reference to the collector) above a predetermined threshold with a view to rendering the transistor conductive.

By reversing all the types of conductivity and the signs of the applied potentials an NPN type transistor can be similarly produced, which is adapted to be rendered conductive by a negative potential sufficiently lower than the collector potential, and can be blocked by a potential of a value close to that of the collector.

The invention is not limited to the embodiments described herein-above and shown in the appended drawing; many modifications and variants may be envisaged by those skilled in the art and without departing from the spirit and scope of the invention as defined in the appended claims.

What is claimed:

1. A semiconductor structure of the bipolar conduction type controlled by an isolated gate which is adapted to render said structure selectively conductive or to block the same, comprising :
   a semiconductor substrate doped with an impurity having a conductivity of a first type, said substrate constituting an emitter area of a vertical bipolar transistor formed in said structure,
   an emitter contact electrically connected to said substrate,
   an epitaxial layer slightly doped with an impurity having a conductivity of a second type opposite to the conductivity of said first type, which epitaxial layer covers said substrate and constitutes a base area of said bipolar transistor,
   a collector area having a conductivity of said first type and strongly doped from the surface of said epitaxial layer in its major portion, said collector area being surrounded by an area wherein said epitaxial layer of second type conductivity is exposed and said collector area being covered on the major portion of its surface with a collector contact;
   a source area constituted by a zone doped from the surface of said epitaxial layer with an impurity having a conduction of said second type, said doped zone being included within said collector area and extending along a border thereof while exposing an interval between said area and said zone, a thin isolating layer covering said interval, and a conductive layer covering said thin isolating layer, so as to constitute the control gate of said structure, and
   a resistive source access zone connected, on the one hand, to said source area and, on the other hand, to said collector contact, the resistance of said zone being sufficiently high to prevent the junction constituted between the source area and the collector area from being rendered conductive when a current passes through the collector.

2. The structure according to claim 1, wherein the collector area is less strongly doped in the interval between its border and the source area than in the inner region.

3. A structure according to any one of claims 1 or 2, wherein the resistive source access zone is constituted by at least one semiconductor area of said epitaxial layer, said semiconductor area being doped with an impurity of the same type as that of the source area, said semiconductor areas having the shape of narrow lateral projections extending from said source area toward the interior region of the collector area, said collector contact being also in connection with said narrow lateral projections at locations spaced from said source area.

4. The structure of claim 3, wherein said collector contact has a recessed shape at the level of each lateral projection and extends between said lateral projections without being in contact with said source area.

5. A structure according to any one of claims 1 or 2, wherein the resistive source access zone is constituted by a ribbon of polycrystalline silicon deposited on an isolating layer and being in contact with the source area directly or through a metallization layer, and being also in contact with said collector contact.

6. A structure according to claims 1 or 2, wherein the surface of the structure is divided into a plurality of collector areas extending over the major portion of the surface and spaced from each other by narrow intervals wherein said epitaxial layer having said second type of conductivity is exposed, mutually opposed source areas extending along said interval being formed within the adjacent collector areas on either said of said narrow interval, and an isolating layer being provided which covers the space between the mutually opposed source areas, while a conductive layer is deposited on the isolating layer and also covers said space so as to form a common control electrode for the bipolar transistors corresponding to two adjacent collector areas.

* * * * *